(12) United States Patent
Kumar et al.

(10) Patent No.: US 8,521,464 B2
(45) Date of Patent: Aug. 27, 2013

(54) ACCELERATING AUTOMATIC TEST PATTERN GENERATION IN A MULTI-CORE COMPUTING ENVIRONMENT VIA SPECULATIVELY SCHEDULED SEQUENTIAL MULTI-LEVEL PARAMETER VALUE OPTIMIZATION

(75) Inventors: Ashwin Kumar, Hiriadka (IN);
Ramakrishnan Balasubramanian, Santa Clara, CA (US); Rohit Kapur, Cupertino, CA (US); Rajesh Uppuluri, Bangalore (IN); Jyotirmoy Saikia, Bangalore (IN); Parthajit Bhattacharya, Bangalore (IN); Sunil Reddy Tiyyagura, Hyderabad (IN)

(73) Assignee: Synopsys, Inc., Mountain View, CA (US)

( * ) Notice: Subject to any disclaimer, the term of this patent is extended or adjusted under 35 U.S.C. 154(b) by 338 days.

(21) Appl. No.: 12/793,466

(22) Filed: Jun. 3, 2010

(65) Prior Publication Data
US 2011/0301907 A1 Dec. 8, 2011

(51) Int. Cl.
*G01R 31/02* (2006.01)
*G01R 31/00* (2006.01)
*G01R 31/28* (2006.01)
*G01R 31/302* (2006.01)

(52) U.S. Cl.
USPC .......................................... 702/119

(58) Field of Classification Search
USPC ................. 702/117, 119, 120, 124, 179, 183, 702/185; 703/14; 714/732; 716/136
See application file for complete search history.

(56) References Cited

U.S. PATENT DOCUMENTS

| | | | | |
|---|---|---|---|---|
| 7,065,481 | B2 * | 6/2006 | Schubert et al. | 703/14 |
| 7,134,106 | B2 * | 11/2006 | Huang et al. | 716/105 |
| 7,818,644 | B2 * | 10/2010 | Rajski et al. | 714/732 |
| 7,827,510 | B1 * | 11/2010 | Schubert et al. | 716/136 |

OTHER PUBLICATIONS

Zhang, Y., "Parallelized Breadth First Heuristic Search on Shared-Memory Architecture," AAAI Workshop on Heuristic Search, Boston, Jul. 2006, 6 pages.

* cited by examiner

*Primary Examiner* — Marc Armand
*Assistant Examiner* — Felix Suarez
(74) *Attorney, Agent, or Firm* — Fenwick & West LLP

(57) ABSTRACT

Systems and methods provide acceleration of automatic test pattern generation in a multi-core computing environment via multi-level parameter value optimization for a parameter set with speculative scheduling. The methods described herein use multi-core based parallel runs to parallelize sequential execution, speculative software execution to explore possible parameter sets, and terminate/prune runs when the optimum parameter value is found at a previous level. The present invention evaluates the design prior to the implementation of the compression IP so that it can define the configuration of DFT and ATPG to maximize the results of compression as measured by test data volume and test application time.

20 Claims, 7 Drawing Sheets

ACCELERATING AUTOMATIC TEST PATTERN GENERATION IN A MULTI-CORE COMPUTING ENVIRONMENT VIA SPECULATIVELY SCHEDULED SEQUENTIAL MULTI-LEVEL PARAMETER VALUE OPTIMIZATION

BACKGROUND

The present invention relates generally to electronic design automation (EDA) of circuits and in particular to accelerating automatic test pattern generation (ATPG) in multi-core computing environments.

Scan compression technology is essentially logic that provides an interface between the scan-inputs/outputs and the internal scan chains. The architecture that is put into the design is based upon some user specified constraints that are related to the target compression and the available scan terminals. The configuration selected may or may not be the best suited for the design it is inserted in. Usually the architecture can be configured in many different ways. Some configurations are better suited for particular designs than others. If one were able to predict the configuration of the compression intellectual property (IP) to match the needs of the design then one would expect the best results from the compression technology.

As chip design sizes grow, large compute-intensive simulation operations like Test Compression/Coverage Maximization need to run longer for each individual run, and perform more runs due to increased parameter space exploration mandated by additional constraints from ATPG, Design-for-test (DFT), and other areas. Since the runtime is limited by test hardware, testing process has to speedup to limit the runtime of larger designs using existing current hardware capabilities. Maximizing test compression involves searching through the entire set of ATPG/DFT parameters (up to nine levels in the current implementation). The present method involves searching the parameter space in a breadth first fashion. In multi-core nodes, there is benefit in launching multiple sets of parameter search runs in parallel. However, this can only be done on a per-level basis using current methods.

SUMMARY

In various embodiments, the present invention provides methods and systems for accelerating automatic test pattern generation in a multi-core computing environment via sequential multi-level parameter value optimization for a parameter set with speculative scheduling.

The present invention speeds up parallel runs for test compression by parallel execution of sequential runs within the same parameter/level, as well as speculatively scheduling future levels. The methods described herein use multi-core based parallel runs to parallelize sequential execution, speculative software execution, and terminate/prune runs early when the optimum parameter value is found at a previous level. In addition, the number of runs is maximized using search space characteristics.

The present invention focuses on the process of matching the configuration (i.e., the parameters of the compression intellectual property (IP)) to the particular needs of the design so that significantly better results can be achieved. The parameters need to be determined prior to the implementation of the DFT logic and the execution of ATPG. The present invention evaluates the design prior to the implementation of the compression IP so that it can define the configuration of DFT and ATPG to maximize the results of compression as measured by test data volume and test application time.

The description in the specification is not all inclusive and, in particular, many additional features will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

One skilled in the art will readily recognize from the following discussion that alternative embodiments of the structures and methods illustrated herein may be employed without departing from the principles of the present invention.

DETAILED DESCRIPTION OF THE EMBODIMENTS

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures.

Process Flow

Figure 1:
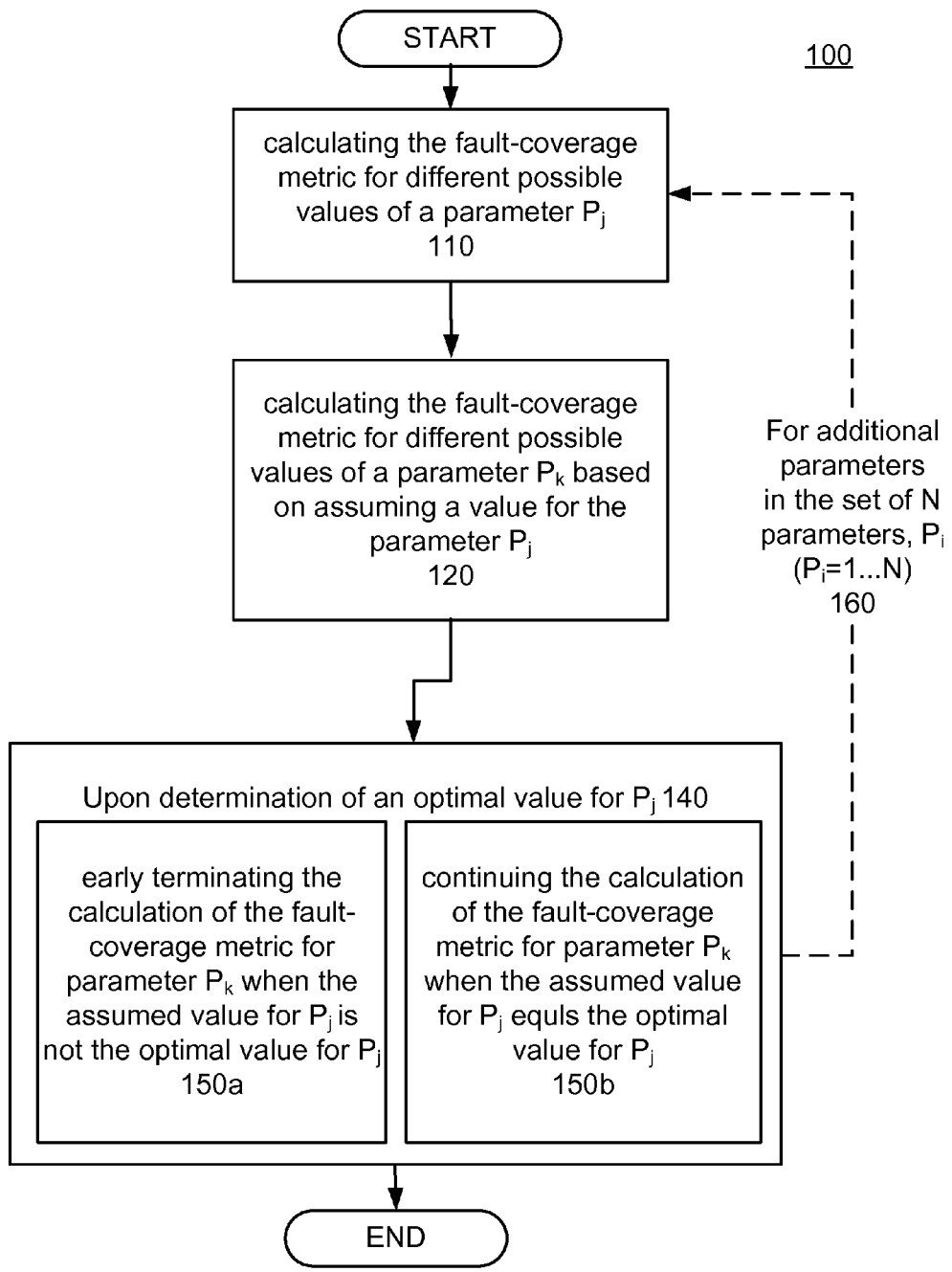
FIG. 1 is a flowchart illustrating a method of accelerating automatic test pattern generation in a multi-core computing environment according to one embodiment of the present invention.

FIG. 1 is a flowchart illustrating a method 100 of accelerating automatic test pattern generation in a multi-core computing environment according to one embodiment of the present invention. The method 100 relies on sequential, multi-level parameter value optimization for a parameter set with speculative scheduling to optimize fault coverage metrics using possible values of N parameters $P_i$, i=1 . . . N (or "set"). In addition, the method 100 maximizes use of available cores/processors and idle cores during runtime.

Most compression tools have defaults for parameters that ensure they perform well on a vast variety of designs. From a user perspective, or for the designer of the compression intellectual property (IP), it is very difficult to tie any of the values for these parameters to any particular design construct. The user typically just knows the number of scan terminals available in their flow. Thus, as a preliminary step, the set of relevant parameters for the method 100 should be determined from the scan and compression architectures for automatic test pattern generation in a multi-core computing environment.

Figure 2:
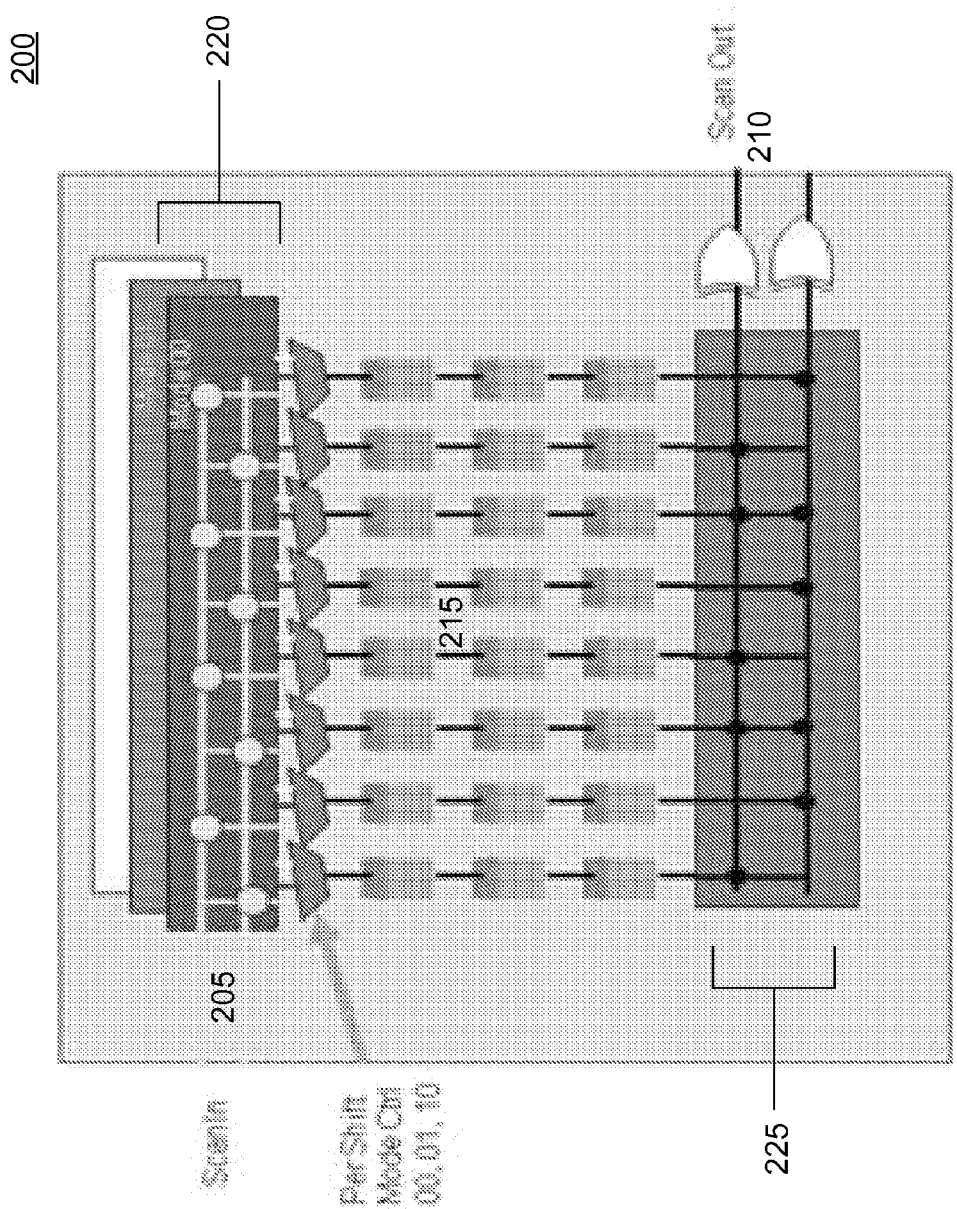
FIG. 2 illustrates an example scan compression architecture according to one embodiment.

FIG. 2 illustrates an example scan compression architecture 200 according to one embodiment. In a scan compression architecture, scan-inputs 205 and scan-outputs 210 are decoupled from the internal scan chains 215. The reduction in chain length resulting from scan compression in turn linearly reduces the test data volume and test application time over the original scan design.

Logic added between the scan-input with the internal scan chains is referred to as a decompressor 220; this is because it takes only a few values to supply a much larger set of receiving flip-flops. Logic added to interface the internal scan chains to the scan-outputs is referred to as a compressor 225, as it takes many values from the flip-flops and funnels the data to a much smaller set of terminals.

Most scan compression architectures are configured based upon the scan interface and the number of internal scan chains 215. However, the decompressor 220 and compressor 225 configuration typically have a large number of parameters for which some default is selected. Sometimes, because of lack of foresight, the architecture does not contain a mechanism for configuring parameters. This does not mean that the parameters do not exist it just means that the design methodology did not leverage the flexibility of potential parameters.

A list of typical parameters in a scan architecture includes: whether masking logic is implemented; whether balanced scan-in and scan-out configurations are used (and if not, what ratios of scan-ins to scan-outs are used); whether inversions are implemented in the decompressor; the number of modes (multiplexer configurations in the decompressor); the default target compression for the architecture; and ATPG defaults (e.g., abort limits, merge limits, number of detects per pattern, and the number of clocks that can be pulsed at the same time). It is very difficult to tie any of the values for these parameters to a design construct. The user typically just knows the number of scan terminals available in their flow.

To determine the parameters for the implementation, first the scan chains are virtualized. A DRC (Design Rule Checker) is run to determine which flip-flops can be assumed to be scanned. Next the compression architecture is virtualized by populating the ATPG data structures that would have been a result of a DRC run on an actual compression implementation. As a result of virtualization, ATPG can operate as if the test architecture was implemented. The environment is not exactly the same as in the final implementation, however, it is close enough for this purpose.

Returning now to FIG. 1, the initial virtualization can be incrementally changed to account for the different parameter settings of the compression architecture, providing a platform for running an evaluation algorithm for each of the parameter values. The virtualization environment allows for multiple configurations to be evaluated. However, given the number of possibilities created by any compression scheme, it is not beneficial to spend too much time on any one configuration evaluation.

Figure 3:
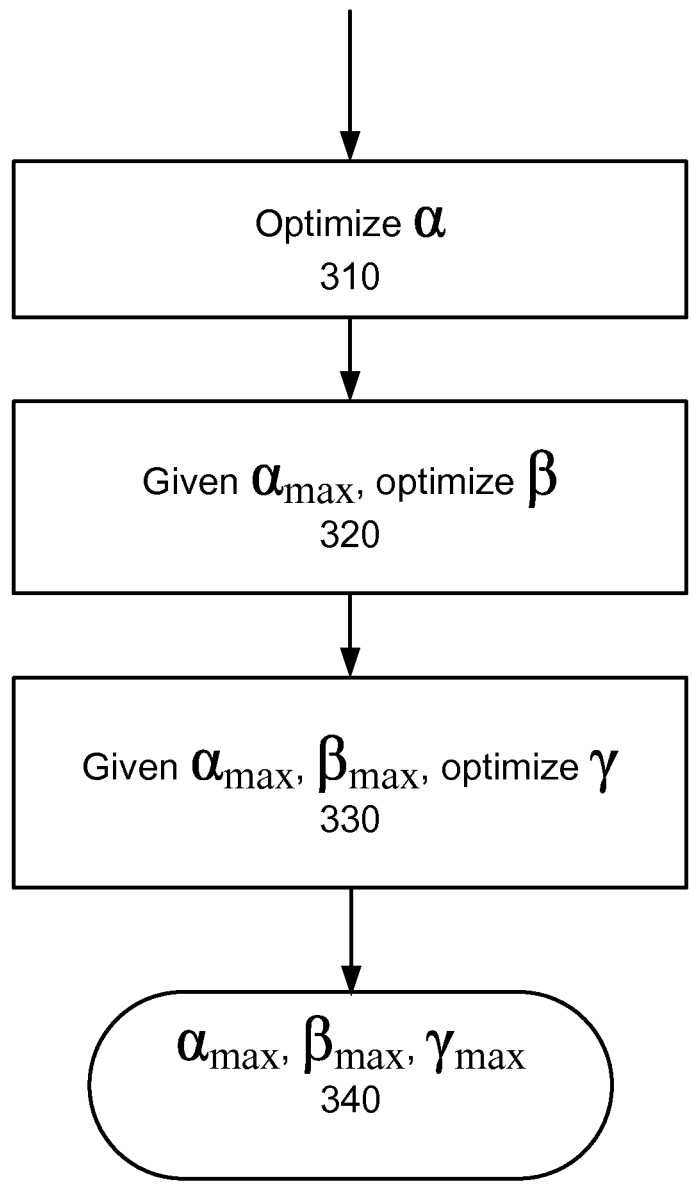
FIG. 3 illustrates a sequential approach to optimizing parameters wherein at each step an exhaustive evaluation is performed of a single parameter's settings keeping all other parameters constant according to one embodiment.

Thus, the method 100 uses a sequential approach to optimizing the parameters wherein at each step an exhaustive evaluation is performed of a single parameter's settings keeping all other parameters constant. This concept is shown in FIG. 3, in which parameters $\alpha$, $\beta$, $\gamma$ are optimized in order, with the results of the first optimization used in the optimization of the next. A subscript max is used to identify the result of the optimization of the associated parameter. Each parameter has a different number of discrete values and the runtime of each optimization could be different. For example the amount of pattern sampling used for optimizing one parameter could differ from that of another parameter. Also, if the parameter represented an effort level of the algorithms search space, then different settings of the effort would result in different runtimes. In one embodiment, the calculations for different values of a parameter access common data stored in the shared memory and use local memory for data specific to the parameter value.

First, parameter $\alpha$ is optimized 310 (to $\alpha_{max}$). Next, using $\alpha_{max}$, parameter $\beta$ is optimized 320 (to $\beta_{max}$). Then, using both $\alpha_{max}$ and $\beta_{max}$, parameter $\gamma$ is optimized 330 (to $\gamma_{max}$). The result 340 is $\alpha_{max}$, $\beta_{max}$, $\gamma_{max}$.

Referring again to FIG. 1, once the parameter values have been enumerated ($P_j$ herein), a fault-coverage metric is calculated 110 for different values of a parameter in a parameter set ($P_i$, where i=1 ... N). The fault coverage is determined for each parameter value in turn. Continuing with the above example, initially $P_j$ is a first level parameter (e.g., $\alpha$, and the values are $\alpha_1$, $\alpha_2$, ... $\alpha_n$). However, $P_j$ also may be $\beta$, with values $\beta_1, \beta_2, \ldots \beta_n$. The fault-coverage metric corresponds to fault coverage for the values of the parameter after a sample of initial patterns in an ATPG execution, wherein a higher fault-coverage metric corresponds to a lower final test pattern count (highest equals optimized).

Figure 4:
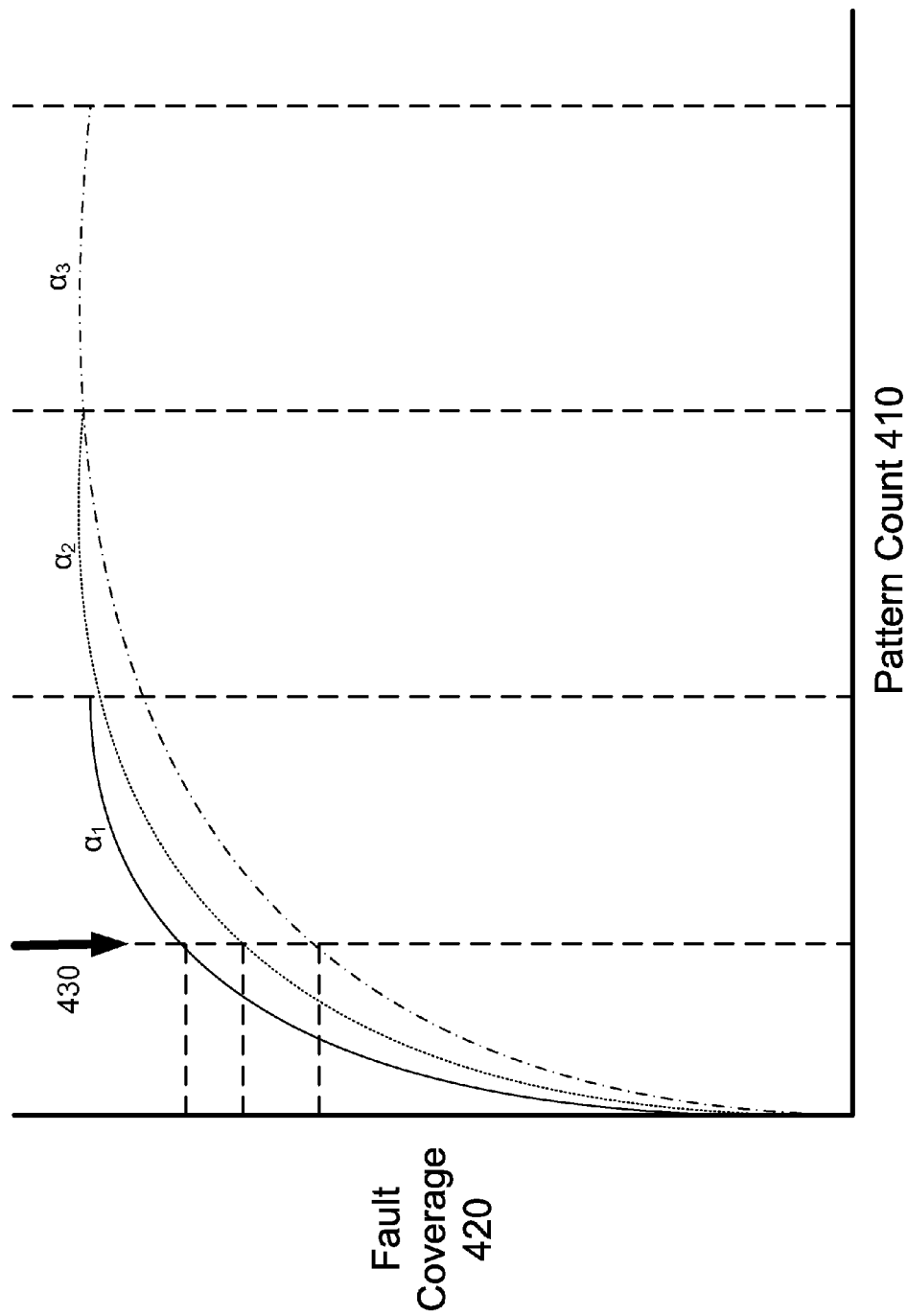
FIG. 4 shows conceptual fault coverage curves representing three different runs of the DFT/ATPG under different settings according to one embodiment.

FIG. 4 shows conceptual fault coverage curves (for $\alpha_1$, $\alpha_2$, $\alpha_3$) to show the relationship between pattern count 410 and fault coverage 420 for different values of the parameters of the test architecture. The three fault coverage curves represent three different runs of the DFT/ATPG for three different values. For the many possible values of the parameters of the test architecture many fault coverage curves can be plotted against the pattern count. The curve that achieves complete fault coverage with fewest patterns corresponds to the optimal value for the parameter. The fault coverage seen by the first few patterns is an indicator for the overall pattern count of the run. In one embodiment, a few patterns is $X^n$ patterns, where X is 64 and n is a non-zero number. The sample point at which the fault coverage is measured (after just a few patterns) is depicted by line 430. The curve for parameter $\alpha_1$ has the highest fault coverage at that point relative to the $\alpha_2$ and $\alpha_3$ curves. The pattern count of the $\alpha_1$ curve at the end of the execution is the lowest of different runs representing the optimal value/run.

Thus, the method 110 of FIG. 1 iterates over the various parameters in a virtual environment on a sample of faults and patterns to determine the optimum settings of the parameters prior to the implementation of the test architecture. Traversing the search space, the parameters are optimized in a sequential fashion where the result of a parameter optimization is used to optimize the next parameter. The search for the optimum solution in this case is a well known breadth-first search algorithm; methods exist for parallelizing the breadth-first search algorithm. See, e.g., Y. Zhang, and Eric A. Hansen, "Parallelized Breadth First Heuristic Search on Shared-Memory Architecture," AAAI Workshop on Heuristic Search, Boston, July 2006. Known approaches look at a level-by-level traversal of the tree and exploit the parallelism that is intuitive in the breadth-first search. The method 100 according to the present invention enhances the multithreaded approach with intelligence added in to prune the search space in real-time. In order to prune the search space, the paths the solution will take must be explored, as well as the criteria for rejection of certain paths must be known. The criterion for rejection of a particular path (indirectly the node) is the coverage that it provides relative to other nodes in the same level (e.g., $\alpha$, $\beta$, $\gamma$).

After beginning the initial parameter (e.g., $P_j$) value determination, fault-coverage metrics for values of a subsequent parameter (e.g., $P_k$) in the parameter set are calculated 120 (speculatively scheduled) along paths corresponding to the values of the previous parameter ($P_j$) based on an assumed value for it. The calculations for the subsequent parameter are executed on processing cores that are not executing the calculations for the previous parameter, speculatively scheduling additional parameter dimensions whenever there is available free compute capacity. Thus, available compute capacity (e.g., determination of cores not executing calculations) of the processing cores also may be assessed as part of this step.

Once the determining 110 is complete, the fault-coverage metrics are compared among the values to determine 140 the optimum value for the parameter. In addition, speculatively scheduled determinations of fault-coverage metrics for values of a subsequent parameter that are not along the path from the optimum value, i.e., for calculations 120 of $P_k$ in which when the assumed value for Pj is not the optimal value for Pj, are terminated 150a. However, for the speculatively scheduled determinations of fault-coverage metrics for values of the subsequent parameter that are along the path from the optimum value for the parameter as established in step 110, i.e., for calculations 120 of $P_k$ in which when the assumed value for Pj is the optimal value for Pj, the determinations continue 150b. Partially executed calculations of the fault-coverage metric for the subsequent parameter ($P_k$) based on assuming a value for the previous parameter ($P_j$) are ignored once the calculations determine that the assumed value in step 120 is not the optimal value. The process continues 160 for the additional parameters in the set ($P_i$). This step reduces the overall runtime by utilizing the maximum number of cores.

At some levels, the coverage function is monotonic between the values for a parameter. In such cases, additional runtime savings can be had by scheduling lesser number of runs at a given level. For example, if we know that coverage varies monotonically with $\alpha$, it is enough to schedule $\alpha_l$ and $\alpha_n$. In other levels it may be only required to look at the coverage values in the boundaries of the parameter set. This will give us an approximate course or path to take in the tree, thus pruning the parameter set. This abbreviated scheduling is possible to do from an analysis of previous runs of past designs, and by identifying broad patterns of variation of objective function for each parameter. The method is further described in conjunction with the modules described in FIG. 7.

The memory footprint is reduced for the overall run and runtime by launching each multi-threaded run within a lightweight process container. Doing so allows for most of the memory between runs to be shared according to one embodiment. According to one embodiment, techniques are used for the parallel runs to share memory with the parent process, and the data is communicated back to the parent process at end of the run. The overhead incurred by using this technique is minimal compared to the traditional methods that use synchronization and interprocess communication.

By matching the IP (i.e., the parameters of the IP) to the particular needs of the design, better results can be achieved. The parameters need to be determined prior to the implementation of the DFT logic and the execution of ATPG. The design is evaluated prior to the implementation of the compression IP so that it can define the configuration of DFT and ATPG to maximize the results of compression as measured by test data volume and test application time.

Figure 5:
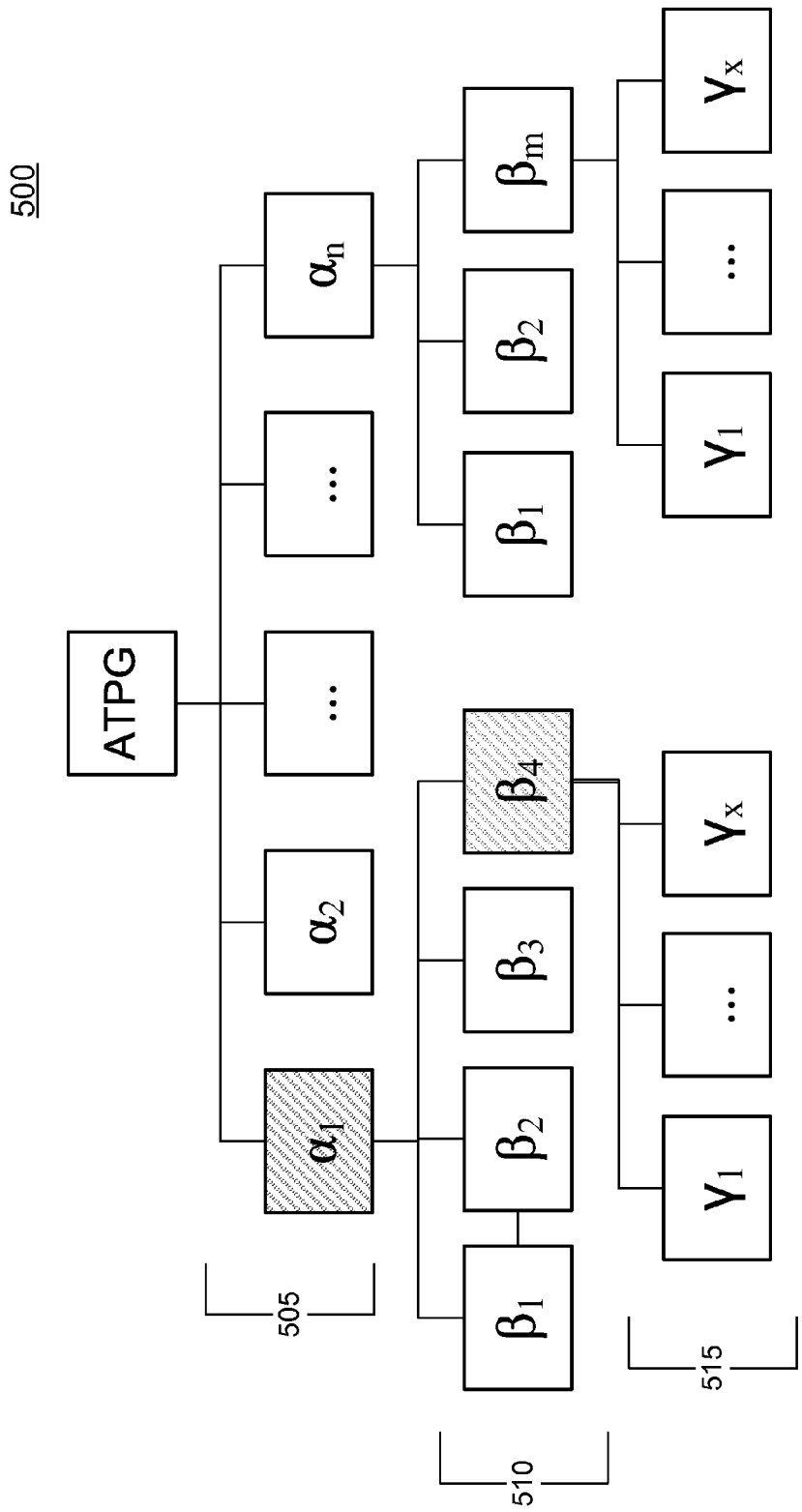
FIG. 5 represents the solution space for the method of FIG. 1 in a tree structure according to one embodiment.

FIG. 5 represents the solution space for the method of FIG. 1 in a tree structure 500 according to one embodiment. The three parameters shown are $\{\alpha, \beta, \gamma\}$. This is an example for three parameters and can be generalized for the N parameter case (e.g., N parameters $P_i$, where i=1 ... N). The method works by sequentially working to maximize the coverage c over each of the parameters. The sequential flow is then a breadth-first search algorithm that finds a path from the root node to the leaf node, i.e., from the first level 505 ($\alpha$), to the second level 510 ($\beta$), to the third level 515 ($\gamma$).

For example, consider a second level exploration on four threads, with the optimization to be performed over three parameter levels $\{\alpha, \beta, \gamma\}$. The threads are exploring [$\{\alpha_{max}, \beta_1\}$, $\{\alpha_{max}, \beta_2\}$, $\{\alpha_{max}, \beta_3\}$, $\{\alpha_{max}, \beta_4\}$]. Now if the last thread, $\{\alpha_{max}, \beta_4\}$, is completed, and $\beta$ has only four possible values, we can start exploring a path $\{\alpha_{max}, \beta_4, \gamma_1\}$. If the coverage given by $\{\alpha_{max}, \beta_3\}$ is greater than the coverage given by $\{\alpha_{max}, \beta_4\}$, we can stop exploring the $\{\alpha_{max}, \beta_4\}$ path.

Thus, results from the currently explored paths can be actively monitored and the search space intelligently pruned. In case $\{\alpha_{max}, \beta_4\}$, gives the maximum coverage in that level, we are already exploring possible paths in that search space. Further, additional such checks can be added to reduce the runtime in a given level. For example, at levels at which the coverage function is monotonic between the values for a parameter, additional runtime savings can be had by scheduling lesser number of runs at a given level. At other levels it is necessary only to look at the coverage values in the boundaries of the parameter set.

A particular run (a collection of paths being explored) is said to be complete when we can take a decision on pruning the tree. For example, if [$\{\alpha_{max}, \beta_1\}$, $\{\alpha_{max}, \beta_2\}$, $\{\alpha_{max}, \beta_3\}$, $\{\alpha_{max}, \beta_4\}$,] are being explored in the current run, it is said to be complete when all values of $\beta$ have been explored. Meanwhile we can continue to schedule jobs of the kind path $\{\alpha_{max}, \beta, \gamma\}$.

This speculative scheduling based parallelism produces a better result than the sequential run as long as overheads and parallel efficiency do not increase the run-time for each parallel run beyond the time required for the sequential run.

EXAMPLE

To further illustrate the method 100, the following example shows the multi-level parameter value optimization in an Adaptive Scan™ environment.

Recall that the parameters for a particular architecture need to be determined prior to the implementation of the DFT logic and the execution of ATPG. In this example using Synopsys' Adaptive Scan™ compression solution, the default parameters for DFTMAX are: Masking logic is always implemented for blocking Xs; balanced scan-in and scan-out configurations are used; no inversions are implemented in the decompressor; the number of modes (multiplexer configurations in the decompressor) implemented varies between 2 and 3 depending upon the amount of compression being targeted; default target compression is 10×; and ATPG defaults include abort limits (10), merge limits, number of detects per pattern (1) and the number of clocks that can be pulsed at the same time (default allows multiple clocks to be pulsed at the same time).

In this example two parameters were evaluated: whether masking logic was used or not and different numbers of scan-input/output configurations. Fault-coverage metrics were determined for masking logic values of yes or no, and for 9 scan-input/output configurations (4-12, 5-11, 6-10, 7-9, 8-8, 9-7, 10-6, 11-5, and 12-4).

The results are shown in Tables 1 and 2.

TABLE 1

| Adaptive Scan scanin-scanout | 4-12 | 5-11 | 6-10 | 7-9 | 8-8 | 9-7 | 10-6 | 11-5 | 12-4 |
|---|---|---|---|---|---|---|---|---|---|
| Pattern Count | 6267 | 5870 | 5354 | 4788 | 4914 | 3819 | 4323 | 4040 | 4095 |
| Fault Coverage | 94.07 | 94.13 | 94.02 | 93.64 | 92.50 | 92.06 | 88.01 | 83.61 | 74.00 |
| Compression Achieved | NA | NA | NA | NA | NA | NA | NA | NA | NA |
| Compression Maximizer evaluation metric (internal tool data) | 41.24 | 40.59 | 41.40 | 32.98 | 37.86 | 38.20 | 26.58 | 26.75 | 26.81 |

TABLE 2

| Adaptive Scan scanin-scanout | 4-12 | 5-11 | 6-10 | 7-9 | 8-8 | 9-7 | 10-6 | 11-5 | 12-4 |
|---|---|---|---|---|---|---|---|---|---|
| Pattern Count | 3598 | 4281 | 5500 | 8281 | 9467 | 7886 | 7138 | 7486 | 8236 |
| Fault Coverage | 98.38 | 98.37 | 98.27 | 98.30 | 98.17 | 98.31 | 98.28 | 98.29 | 98.29 |
| Compression Achieved | 62x | 52x | 41x | 27x | 23x | 28x | 31x | 30x | 27x |
| Compression Maximizer evaluation metric (internal tool data) | 70.09 | 60.81 | 47.99 | 42.83 | 41.12 | 34.94 | 33.93 | 32.24 | 30.52 |

Table 1 and Table 2 show the internal data for fault coverage metrics for a 25171 flip-flop design with 16 bi-directional scan-terminals in which two parameters were evaluated in an exhaustive manner.

Table 1 shows the condition when the mask is not implemented and Table 2 shows the condition when the mask is implemented. The scan-inputs and scan-outputs are varied within the allowable range for Adaptive Scan™ to be implemented (minimum of configuration allowed in Adaptive Scan is 4-4 representing 4 scan-inputs and 4 scan-outputs). The combined data of the two tables represents all possible combinations of the two parameters. Data for the complete implementation is also shown in rows 2, 3, and 4 of both tables. When complete fault coverage is not achieved for a configuration, the achieved compression is marked as not applicable (NA). During the optimization process, the method 100 generates the data seen in the fifth row of both tables according to one embodiment. This data is the metric used to evaluate the configuration which is representative of the fault coverage at the arrow 430 of FIG. 4. The highest fault coverage metric (70.09) identifies the best configuration.

In this example, the method 100 results suggest selecting the 4-12 scan-input to scan-output configuration when 16 scan terminals were provided with masking implemented. If that configuration is implemented, the user would see 62× compression. By comparison, using defaults for DFTMAX would have implemented masking logic with a balanced 8-8 scan input-output configuration which would have resulted in only 23× compression in this case.

Computer Architecture

Figure 6:
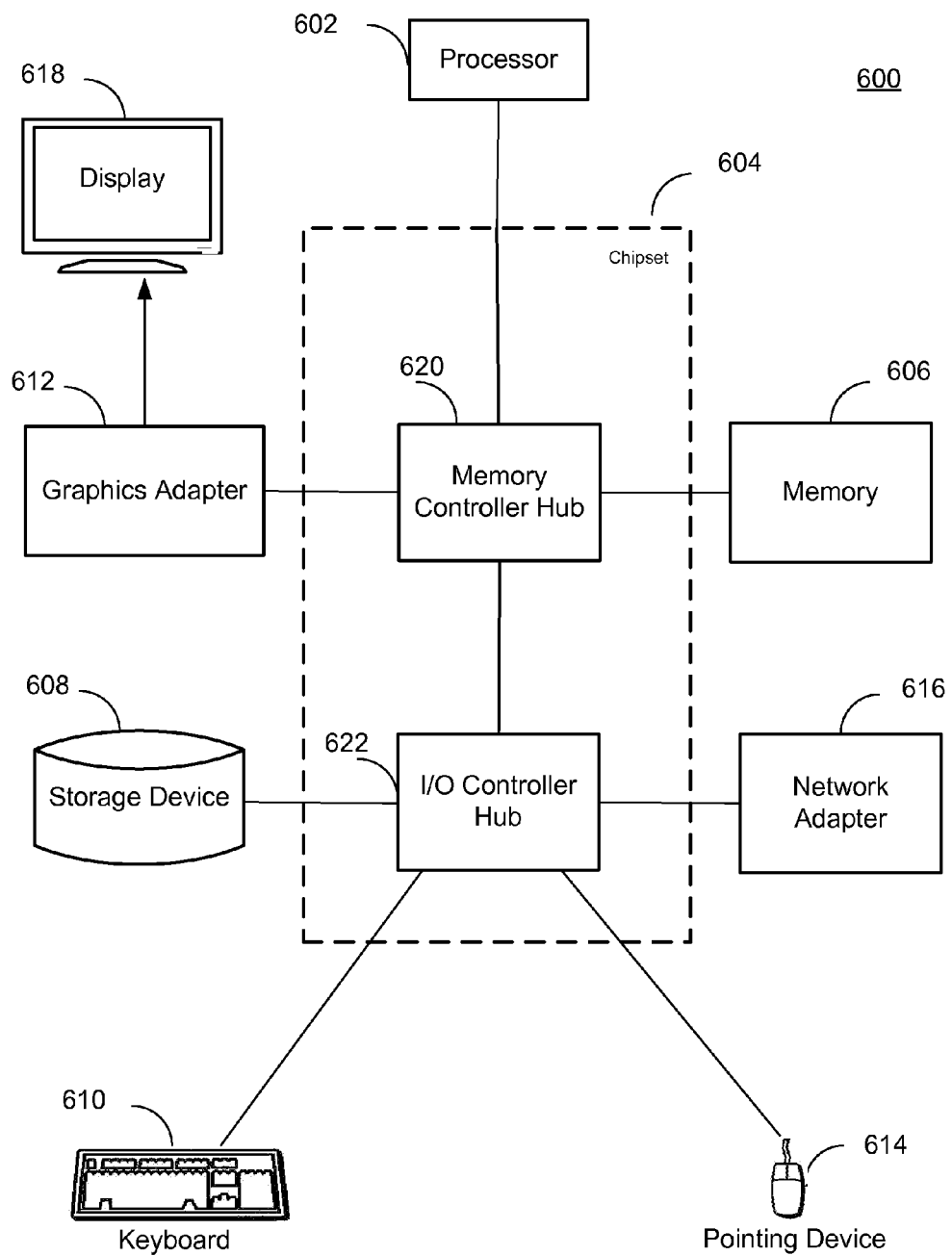
FIG. 6 is a high-level block diagram illustrating an example computer that can be used for processing the steps of the processes described herein according to one embodiment.

FIG. 6 is a high-level block diagram illustrating an example computer 600 that can be used for processing the steps of the processes described herein according to one embodiment. The computer 600 includes at least one processor 602 coupled to a chipset 604. The processor 602 may be a multi-core processor according to one embodiment. The chipset 604 includes a memory controller hub 620 and an input/output (I/O) controller hub 622. A memory 606 and a graphics adapter 612 are coupled to the memory controller hub 620, and a display 618 is coupled to the graphics adapter 612. The memory 606 may be a shared memory. The computer 600 also may include a local memory according to one embodiment.

A storage device 608, keyboard 610, pointing device 614, and network adapter 616 are coupled to the I/O controller hub 622. Other embodiments of the computer 600 have different architectures.

The storage device 608 is a non-transitory computer-readable storage medium such as a hard drive, compact disk read-only memory (CD-ROM), DVD, or a solid-state memory device. The memory 606 holds instructions and data used by the processor 602. The memory 606 maintains shared memory data structures and resources according to one embodiment. The pointing device 614 is a mouse, track ball, or other type of pointing device, and is used in combination with the keyboard 610 to input data into the computer system 600. The graphics adapter 612 displays images and other information on the display 618. The network adapter 616 couples the computer system 600 to one or more computer networks.

The computer 600 is adapted to execute computer program modules for providing the functionality described herein. As used herein, the term "module" refers to computer program logic used to provide the specified functionality. Thus, a module can be implemented in hardware, firmware, and/or software. In one embodiment, program modules are stored on the storage device 608, loaded into the memory 606, and executed by the processor 602. The types of computers 600 used can vary depending upon the embodiment and requirements. For example, a computer may lack displays, keyboards, and/or other devices shown in FIG. 6.

Figure 7:
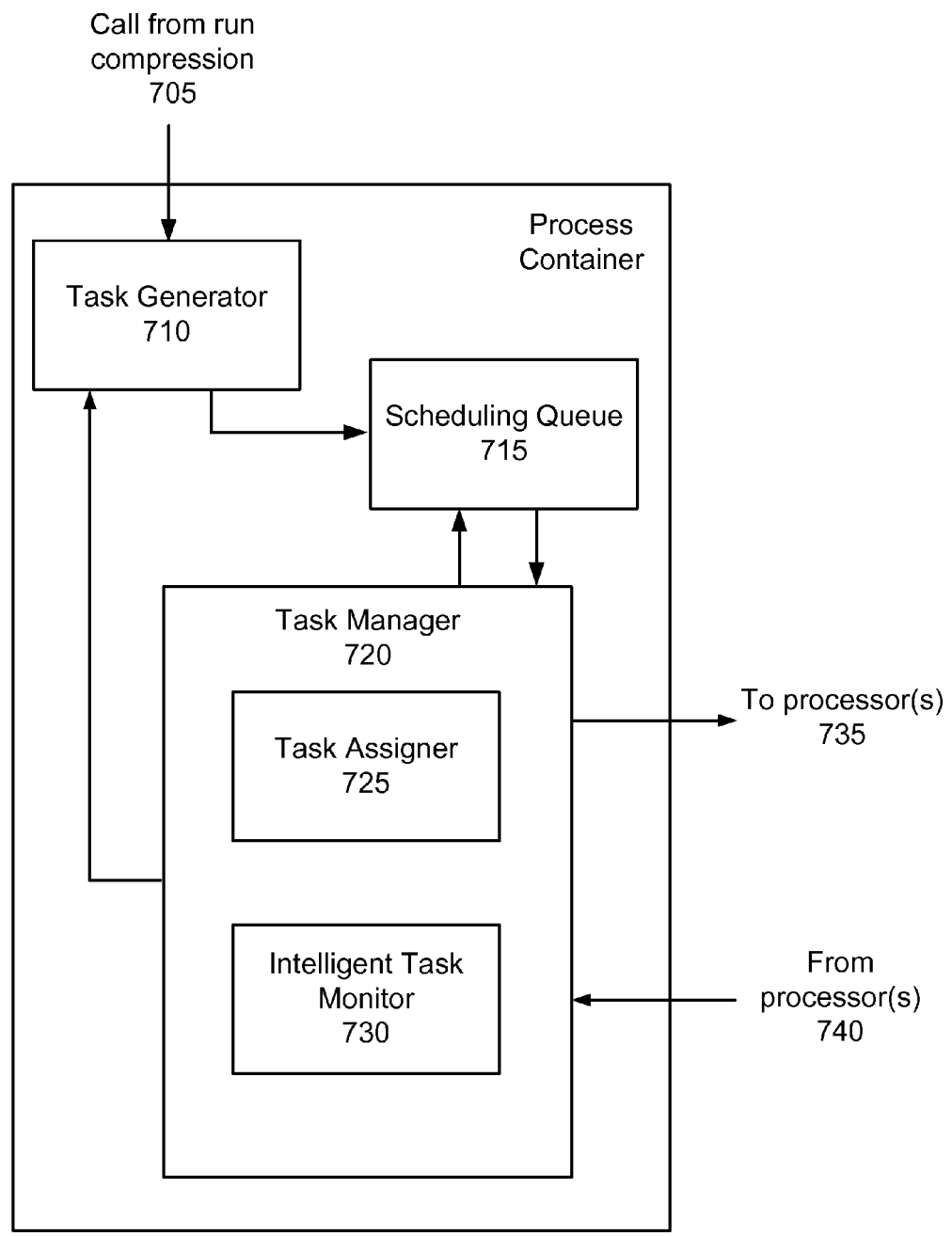
FIG. 7 shows computer-executable program modules and associated structures for providing the functionality described herein according to one embodiment.

FIG. 7 shows computer-executable program modules 710-730 and associated structures for providing the functionality described herein according to one embodiment, e.g., as described in conjunction with FIG. 1. In one embodiment, the program modules 710-730 are stored on the storage device 608, loaded into the memory 606, and executed by the processor 602.

In response to receiving a run compression call 705, the Task Generator 710 enables the system 600 to generate tasks, i.e., possible solution path configurations, and attaches a process to be called for running the particular set of parameters, and is one means for so doing. For example, the Task Generator 710 may provide paths such as discussed in conjunction with FIG. 5 and in conjunction with the method of FIG. 1, based on the parameters for the particular architecture used. The Task Generator 710 is communicatively coupled to and passes the process to the Scheduling Queue 715 module. The list of tasks to be processed is modified based on the Intelligent Task Monitor 730, for example, as a result of terminating subsequent level determinations for value along a non-optimum path (e.g., 150*a* of FIG. 1). Each task is given a unique ID. Also associated with each of the tasks is a function that is used to find the coverage for that particular configuration.

The Scheduling Queue 715 is a priority queue module that holds the tasks before they are assigned to the processors for execution according to one embodiment. The priority of the tasks can be altered based on the coverage results. The Scheduling Queue 715 is communicatively coupled to the Task Generator 710 and Task Manager 720.

The Task Manager 720 is the master controller module in the system and manages the task assignment and pruning. The Task Assigner 725 is a module that assigns 735 the tasks to the processors, and also has application program interfaces to allow early termination of tasks. The Task Assigner 725 recognizes when one or more processing cores have become idle (e.g. because they are not executing calculations for another parameter in the set) and fills them with scheduled tasks. The Intelligent Task Monitor 730 is a module that maintains the solution space by reordering the solutions according to coverage, as information is received 740 from the processors, as the method 100 progresses through the parameters. The Intelligent Task Monitor 730 takes decisions on the runs/tasks to terminate based on completion of a parameter and determination of the optimum value for that parameter as described in conjunction with FIG. 1. It also directs the Task Generator 710 to prune the search space by discarding paths.

The above modules 710-730 need not be discrete software modules. The software configuration shown is meant only by way of example; other configurations are contemplated by and within the scope of the present invention.

When the modules take the form of a software application, they may be provided to the computer 600 on a non-transitory computer readable storage medium, or by electronic communication over a network, for installation and execution thereon.

The present invention has been described in particular detail with respect to one possible embodiment. Those of skill in the art will appreciate that the invention may be practiced in other embodiments. First, the particular naming of the components, capitalization of terms, the attributes, data structures, or any other programming or structural aspect is not mandatory or significant, and the mechanisms that implement the invention or its features may have different names, formats, or protocols. Further, the system may be implemented via a combination of hardware and software, as described, or entirely in hardware elements. Also, the particular division of functionality between the various system components described herein is merely exemplary, and not mandatory; functions performed by a single system component may instead be performed by multiple components, and functions performed by multiple components may instead performed by a single component.

Some portions of above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Unless specifically stated otherwise as apparent from the above discussion, it is appreciated that throughout the description, discussions utilizing terms such as "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by real time network operating systems.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for comparing timing constraints of circuits. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

What is claimed is:

1. A computer-implemented method, comprising:
calculating fault-coverage metrics for different values of a first parameter $P_j$ on a first subset of a plurality of processing cores; and
calculating fault-coverage metrics for different values of a second parameter $P_k$ based on an assumed optimal value for the first parameter $P_j$ on a second subset of the plurality of processing cores in parallel with the calculating of the fault-coverage metrics for different values of the first parameter Pj on the first subset of the plurality of processing cores, the fault-coverage metrics for the second parameter $P_k$ depending the different values of the first parameter $P_j$.

2. The method of claim 1, wherein the calculations for different values of the first parameter $P_j$ access common data stored in a shared memory and use a local memory for data specific to the parameter value.

3. The method of claim 1 further comprising:
terminating the calculation of the fault-coverage metrics for a subset of the different values of the second parameter $P_k$ based on the assumed optimal value for the first parameter $P_j$ in response to the calculations for the first parameter $P_j$ indicating that the assumed value for $P_j$ is not the optimal value for $P_j$.

4. The method of claim 1 further comprising:
continuing the calculation of the fault-coverage metrics for a subset of the different values of the second parameter $P_k$ based on the assumed optimal value for the first parameter $P_j$ in response to the calculations for the first parameter $P_j$ indicating that the assumed value for $P_j$ is the optimal value for $P_j$.

5. The method of claim 1 further comprising:
ignoring partially executed calculations of the fault-coverage metrics for a subset of the different values of the second parameter $P_k$ based on the assumed optimal value for the first parameter $P_j$ in response to the calculations for the first parameter $P_j$ indicating that the assumed value for $P_j$ is not the optimal value for $P_j$.

6. The method of claim 1, wherein the fault-coverage metrics to be optimized correspond to fault coverage after a sample of the different possible values of parameter $P_j$.

7. The method of claim 1, wherein optimization corresponds to a lower final test pattern count.

8. The method of claim 1 further comprising:
determining subsets of the plurality of processing cores that are not executing calculations for a parameter.

9. The method of claim 1 further comprising:
determining the first parameter Pj and the second parameter Pk from scan and compression architectures for automatic test pattern generation.

10. The method of claim 1, wherein the first parameter $P_1$ and the second parameter Pk comprise two selected from the group containing masking logic implementation; balancing/ratios of scan-in and scan-out configurations; decompressor inversion implementation; number of modes; default target compression; and automatic test pattern generation defaults.

11. A computer-implemented system the system comprising:
a plurality of computer processing cores; and
a non-transitory computer-readable storage medium storing instructions configured to execute on one or more of the plurality of computer processing cores, the computer program modules configured to:
calculate fault-coverage metrics for different values of a first parameter $P_j$ on a first subset of the plurality of computer processing cores; and
calculate fault-coverage metrics for different values of a second parameter $P_k$ based on an assumed optimal value for the first parameter $P_j$ on a second subset of the plurality of computer processing cores in parallel with the calculating of the fault-coverage metrics for different values of the first parameter Pj on the first subset of the plurality of computer processing cores, the fault-coverage metrics for the second parameter $P_k$ depending on the different values of the first parameter $P_j$.

12. The system of claim 11, wherein the calculations for different values of the first parameter $P_j$ access common data stored in a shared memory and use a local memory for data specific to the parameter value.

13. The system of claim 11, wherein the non-transitory computer-readable storage medium further stores instructions to:
terminate the calculation of the fault-coverage metrics for a subset of the different values of the second parameter $P_k$ based on the assumed optimal value for the first parameter $P_j$ in response to the calculations for the first parameter $P_j$ indicating that the assumed value for $P_j$ is not the optimal value for $P_j$.

14. The system of claim 11, wherein the non-transitory computer-readable storage medium further stores instructions to:
continue the calculation of the fault-coverage metrics for a subset of the different values of the second parameter $P_k$ based on the assumed optimal value for the first parameter $P_j$ in response to the calculations for the first parameter $P_j$ indicating that the assumed value for $P_j$ is the optimal value for $P_j$.

15. The system of claim 11, wherein the non-transitory computer-readable storage medium further stores instructions to:
ignore partially executed calculations of the fault-coverage metrics for a subset of the different values of the second parameter $P_k$ based on the assumed optimal value for the first parameter $P_j$ in response to the calculations for the first parameter $P_j$ indicating that the assumed value for $P_j$ is not the optimal value for $P_j$.

16. The system of claim 11, wherein the fault-coverage metrics to be optimized correspond to fault coverage after a sample of the different possible values of parameter $P_j$.

17. The system of claim 11, wherein optimization corresponds to a lower final test pattern count.

18. The system of claim 11, wherein the non-transitory computer-readable storage medium further stores instructions to:
determine subsets of the plurality of processing cores that are not executing calculations for a parameter.

19. The system of claim 11, wherein the non-transitory computer-readable storage medium further stores instructions to:
determine the first parameter $P_1$ and the second parameter $P_k$ from scan and compression architectures for automatic test pattern generation.

20. The system of claim 11, wherein the first parameter $P_j$ and the second parameter $P_k$ comprise two selected from the group containing masking logic implementation; balancing/ratios of scan-in and scan-out configurations; decompressor inversion implementation; number of modes; default target compression; and automatic test pattern generation defaults.

* * * * *

UNITED STATES PATENT AND TRADEMARK OFFICE
CERTIFICATE OF CORRECTION

| | |
|---|---|
| PATENT NO. | : 8,521,464 B2 |
| APPLICATION NO. | : 12/793466 |
| DATED | : August 27, 2013 |
| INVENTOR(S) | : Ashwin Kumar et al. |

It is certified that error appears in the above-identified patent and that said Letters Patent is hereby corrected as shown below:

In the Claims

• Column 11, line 23, Claim 1, after "depending," insert --on--
• Column 11, line 62, Claim 10, after "parameter," replace --P1-- with "PJ"
• Column 12, line 1, Claim 11, replace --system-- with "system,"
• Column 12, line 65, Claim 19, replace --parameter P1-- with "parameter PJ"

Signed and Sealed this
Twenty-first Day of July, 2015

Michelle K. Lee
*Director of the United States Patent and Trademark Office*